United States Patent
Park et al.

(10) Patent No.: US 12,230,345 B2
(45) Date of Patent: Feb. 18, 2025

(54) BUILT-IN SELF-TEST CIRCUITS FOR MEMORY SYSTEMS HAVING MULTIPLE CHANNELS

(71) Applicant: Samsung Electronics Co., Ltd., Suwon-si (KR)

(72) Inventors: Jaewon Park, Suwon-si (KR); Shinhaeng Kang, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 130 days.

(21) Appl. No.: 18/059,462

(22) Filed: Nov. 29, 2022

(65) Prior Publication Data

US 2023/0178166 A1    Jun. 8, 2023

(30) Foreign Application Priority Data

Dec. 8, 2021   (KR) .................. 10-2021-0175214
May 27, 2022   (KR) .................. 10-2022-0065291

(51) Int. Cl.
| | | |
|---|---|---|
| *G11C 29/12* | (2006.01) | |
| *G06F 11/00* | (2006.01) | |
| *G11C 29/28* | (2006.01) | |
| *G11C 29/36* | (2006.01) | |

(52) U.S. Cl.
CPC .......... *G11C 29/1201* (2013.01); *G11C 29/28* (2013.01); *G11C 29/36* (2013.01); *G11C 2029/3602* (2013.01)

(58) Field of Classification Search
CPC ..... G11C 29/1201; G11C 29/28; G11C 29/36; G11C 2029/3602; G11C 29/12; G11C 29/14; G11C 2029/1206; G06F 3/0673; G06F 3/0604; G06F 3/0655
See application file for complete search history.

(56) References Cited

U.S. PATENT DOCUMENTS

| | | | |
|---|---|---|---|
| 6,658,610 B1 * | 12/2003 | Chai ...................... | G11C 29/26 |
| | | | 714/6.32 |
| 7,194,670 B2 | 3/2007 | Fales et al. | |
| 7,679,391 B2 | 3/2010 | Watanabe et al. | |
| 7,908,530 B2 | 3/2011 | Chen | |
| 9,406,401 B2 * | 8/2016 | Lo ........................... | G11C 29/26 |
| 9,633,748 B2 | 4/2017 | Shibata | |
| 10,311,964 B2 * | 6/2019 | Wu ......................... | G11C 29/16 |
| 10,460,821 B2 * | 10/2019 | Narayanan ............. | G11C 29/40 |
| 10,692,583 B2 * | 6/2020 | Shin ................. | G01R 31/31703 |
| 11,500,575 B2 * | 11/2022 | Shin ...................... | G06F 3/0673 |

(Continued)

FOREIGN PATENT DOCUMENTS

KR       20090005918 A       1/2009

*Primary Examiner* — Justin R Knapp
(74) *Attorney, Agent, or Firm* — Myers Bigel, P.A.

(57) ABSTRACT

A memory system includes a plurality of memory devices having respective arrays of memory cells therein, a bus electrically coupled to and shared by the plurality of memory devices, and a memory controller. The memory controller, which is electrically coupled to the bus, includes a built-in self-test (BIST) circuit, which is commonly connected to the plurality of memory devices. The BIST circuit is configured to transfer a command set including a test pattern to the plurality of memory devices via the bus, and transfer a command trigger signal for driving the test pattern to the plurality of memory devices via the bus.

17 Claims, 10 Drawing Sheets

(56) References Cited

U.S. PATENT DOCUMENTS

| | | | |
|---|---|---|---|
| 11,721,408 B2 * | 8/2023 | Kim | G06F 11/1068 |
| | | | 714/719 |
| 11,726,139 B2 * | 8/2023 | Sarangi | G01R 31/3187 |
| | | | 714/733 |
| 2009/0219774 A1 * | 9/2009 | Kim | G11C 29/28 |
| | | | 365/201 |
| 2020/0335174 A1 | 10/2020 | Kang et al. | |
| 2021/0174889 A1 | 6/2021 | Ju et al. | |
| 2022/0091776 A1 * | 3/2022 | Shin | G06F 3/0673 |
| 2022/0113889 A1 * | 4/2022 | Park | G11C 29/022 |
| 2022/0122684 A1 * | 4/2022 | Pecha | G11C 29/4401 |

* cited by examiner

BUILT-IN SELF-TEST CIRCUITS FOR MEMORY SYSTEMS HAVING MULTIPLE CHANNELS

REFERENCE TO PRIORITY APPLICATION

This application claims priority under 35 U.S.C. § 119 to Korean Patent Application Nos. 10-2021-0175214, filed Dec. 8, 2021, and 10-2022-0065291, filed May 27, 2022, the disclosures of which are hereby incorporated herein by reference in their entireties.

BACKGROUND

The inventive concept relates to integrated circuit devices and methods of operating same and, more particularly, to integrated circuit memory devices and methods of testing same.

Semiconductor chips are manufactured using large scale semiconductor manufacturing processes, and then tested by test equipment when in a wafer, die, or packaged state. Based on testing, defective portions of a chip (or an entire chip) are identified. In some instances, memory cells identified as defective may be repaired by performing a repair operation on the defective memory cells. According to fine lithography processes, the possibility of an error occurring in semiconductor chips, such as dynamic random access memory (DRAM), in response to a manufacturing process, has increased. In addition, even if an error(s) is not detected during an initial test operation, errors may occur when a chip in the field.

Demands for DRAM having high capacity have increased for stable and quick real-time processing of large capacities of data. However, the performance and quality of DRAMs may vary with time. Accordingly, a memory system may require functions of reliability, availability, and serviceability (RAS) for DRAMs. For example, a memory system may have multiple channels and include a built-in self-test (BIST) circuit configured to perform a test operation and a repair operation on a memory cell array (MCA) connected to each channel. The BIST circuit may provide test patterns for detecting a defective cell in the MCA, however, a hardware configuration of the BIST circuit can be complicated, and the BIST circuit may occupy a relatively large chip area.

A conventional DRAM test process may include: (i) an electrical die sorting (EDS) test for testing chips at a wafer level, (ii) a package test, which is performed after a chip previously determined as "good" from the EDS test is packaged through an assembly process, (iii) a module test performed after a packaged memory chip is formed as a module, and (iv) a mounting test performed after the module is mounted on a board. According to whether a memory chip is defective for each test operation, pass or fail for the memory chip is determined. In a general test method, to ensure a product of good quality, up to a final mounting test on a pass sample for each operation is performed, a final pass sample is processed as a good product, and a defective sample for each operation is processed as a fail.

A memory system having multiple channels may be used by being mounted in a system, such as an electronic device. For example, an application and/or a transaction may be allocated to a memory system. While using a memory system, to which an application and/or a transaction is allocated, a page fault may occur due to a faulty memory. If such a page fault frequently occurs, there may be availability constraints to use an electronic device, such that a normal flow of instruction execution is disrupted to abort and a launched task is restarted.

Accordingly, the significance of a system-level DRAM test has increased. In a mounting test for a memory system having multiple channels, it may be required to perform the test based on a different test pattern for each channel according to an operation of a system in which the memory system is to be mounted. This is to detect a defect which may occur when performing a different operation for each channel. However, when an independent BIST circuit is mounted for each channel, the relative layout size of the multiple BIST circuits may be too great.

SUMMARY

The inventive concepts provide an apparatus and method for efficiently testing a memory system having multiple channels.

According to an aspect of the inventive concept, there is provided a memory system including: (i) a plurality of memory devices, which contain respective arrays of memory cells therein, (ii) a bus connected to and shared by the plurality of memory devices, and (iii) a memory controller connected to the bus. The memory controller is configured to control the plurality of memory devices, and includes a built-in self-test (BIST) circuit that is commonly connected to the plurality of memory devices. Advantageously, the BIST circuit is configured to transfer a command set including a test pattern to the plurality of memory devices via the common bus and transfer a command trigger signal for driving the test pattern to the plurality of memory devices via the bus.

According to another aspect of the inventive concept, there is provided a memory device including a first memory channel, which is coupled to a first memory die, a second memory channel, which is coupled to a second memory die, and a buffer die that is configured to interface with the first and second memory dies via the first and second memory channels. In some aspects, each of the first and second memory dies is stacked on the buffer die and includes a respective memory cell array. In contrast, the buffer die includes a BIST circuit, which is commonly connected to the first and second memory channels. Advantageously, the BIST circuit is configured to transfer a command set (including a test pattern) to the first and second memory dies via the corresponding first and second memory channels, and transfer a command trigger signal for driving the test pattern to the first and second memory dies via the first and second memory channels.

According to still another aspect of the inventive concept, there is provided a method of testing first and second memory channels including respective first and second memory cell arrays therein, by using a BIST circuit, which is commonly connected to the first and second memory channels. The method includes having the BIST circuit transfer a command set (including a test pattern) to the first and second memory channels, and transfer a command trigger signal for driving the test pattern to the first and second memory channels, and then testing each of the first and second memory channels by driving them with different test pattern in response to the command trigger signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
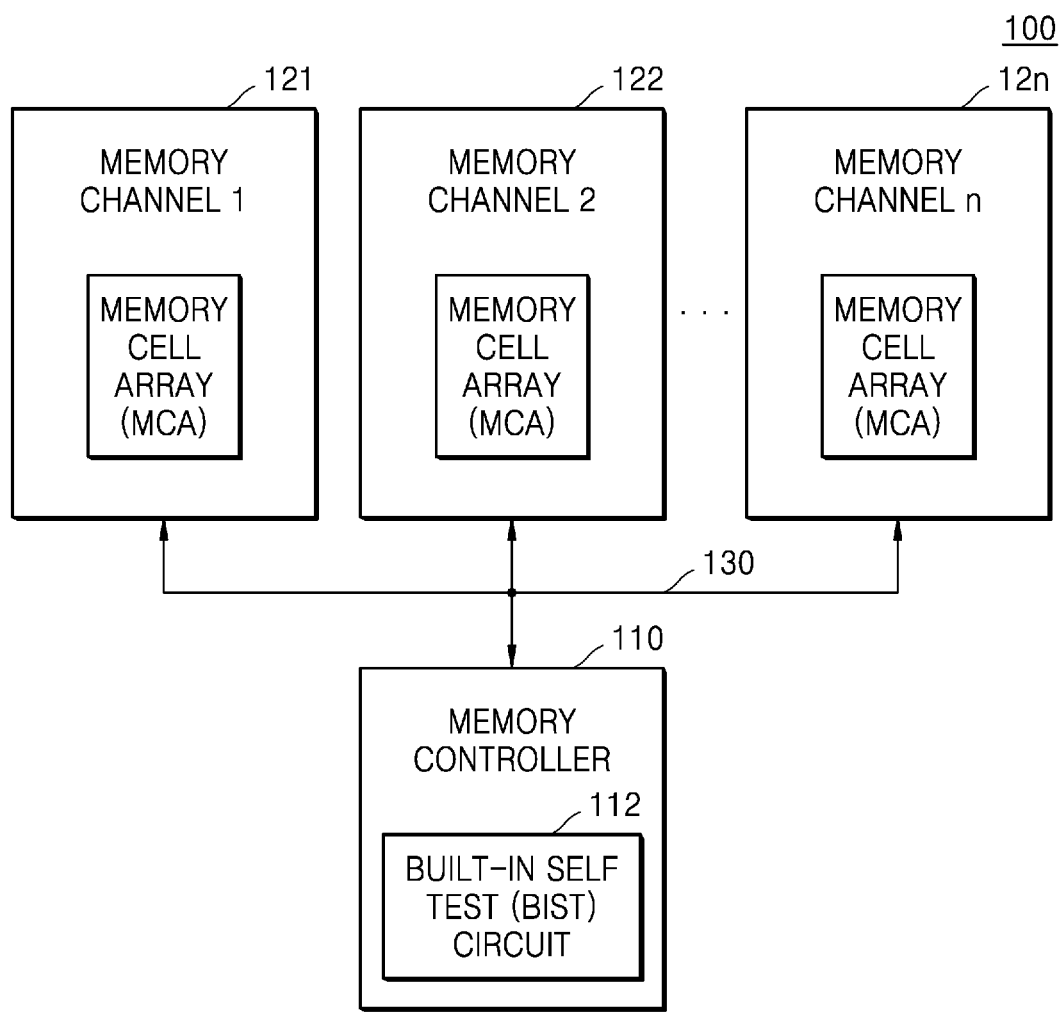
FIGS. 1 and 2 are block diagrams illustrating conventional multi-channel memory systems.
Figure 2:
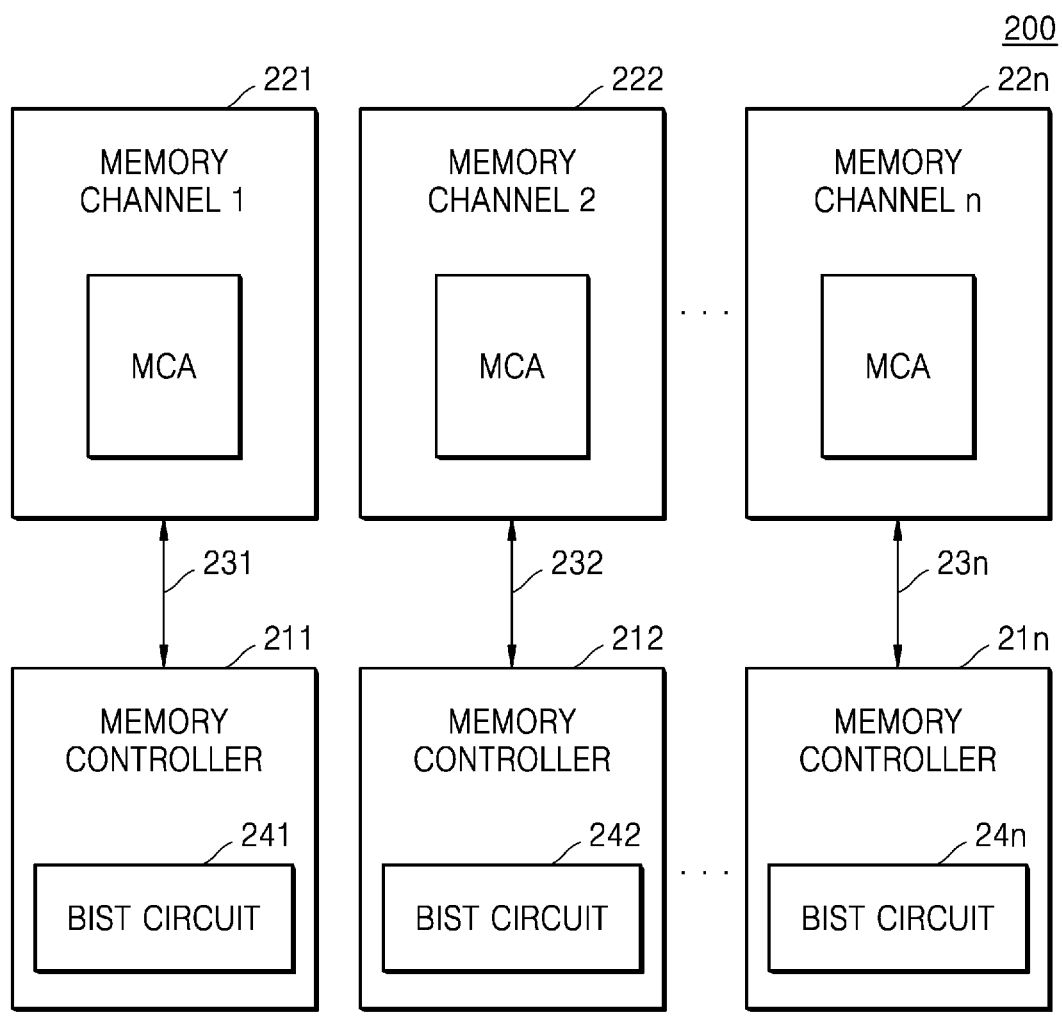

FIGS. 1 and 2 are block diagrams illustrating typical multi-channel memory systems 100 and 200, respectively. FIG. 1 illustrates a shared built-in self-test (BIST) structure in which a plurality of memory channels 121, 122, ..., 12n are connected to a memory controller 110 via a single bus (130), and FIG. 2 illustrates a distributed BIST structure in which a plurality of memory channels 221, 222, ..., 22n are connected to memory controllers 211, 212, ..., 21n via individual buses 231, 232, ..., 23n, respectively.

Referring to FIG. 1, the memory system 100 may include the memory controller 110, the plurality of memory channels 121, 122, ..., 12n, and the bus 130. The memory controller 110 may control a memory access operation, such as a write operation or a read operation, etc., which is performed on the plurality of memory channels 121, 122, ..., 12n. The memory controller 110 may be implemented by one or more hardware components (e.g., an analog circuit and a logic circuit), software program code, and/or firmware program code for memory interfacing, such as selecting a row and a column corresponding to a memory cell, writing data in a memory cell, or reading written data.

Although the illustration of the bus 130 is shown as a single signal line between the memory controller 110 and each of the plurality of memory channels 121, 122, ..., 12n, the bus 130 may actually include a plurality of signal lines. Moreover, the bus 130 may be connected to connectors respectively connecting the memory controller 110 to the plurality of memory channels 121, 122, ..., 12n, and the connectors may be implemented by pins, balls, signal lines, and/or other hardware components. For example, a clock signal CLK, a command/address signal CMD/ADDR, data DQ, and the like may be transmitted and received via the bus 130 between the memory controller 110 and each of the plurality of memory channels 121, 122, ..., 12n. The bus 130 may be implemented by a single channel including a plurality of signal lines or by a plurality of channels. The bus 130 may also be referred to as a channel, and in the embodiments described hereinbelow, the terms "bus 130" and "channel" may be used interchangeably.

Each of the plurality of memory channels 121, 122, ..., 12n may be a memory device including an independent interface, which is configured to write or read data in or from a memory cell array (MCA) under control by the memory controller 110. The MCA may include a plurality of word lines, a plurality of bit lines, and a plurality of memory cells formed at points at which the plurality of word lines intersect with the plurality of bit lines. Each of the plurality of memory cells may be a dynamic random access memory (DRAM) cell including one access transistor and one storage capacitor. The MCA may include a plurality of memory banks, and each of the plurality of memory banks may include a normal cell array and a redundancy cell array.

For example, each of the plurality of memory channels 121, 122, ..., 12n may be a corresponding DRAM device. However, the scope of the inventive concept is not limited thereto, and each of the plurality of memory channels 121, 122, ..., 12n may be any one of volatile memory devices, such as synchronous DRAM (SDRAM), double data rate SDAM (DDR SDRAM), low power double data rate SDAM (LPDDR SDRAM), graphics double data rate SDAM (GDDR SDRAM), DDR2 SDRAM, DDR3 SDRAM, DDR4 SDRAM, DDR5 SDRAM, wide input/output (I/O) DRAM, a high bandwidth memory (HBM), and a hybrid memory cube (HMC). According to an embodiment, each of the plurality of memory channels 121, 122, ..., 12n may be a group of memory devices mounted in a memory module. The memory module may be implemented by a unbuffered dual in-line memory module (UDIMM), a registered DIMM (RDIMM), a load reduced DIMM (LRDIMM), a fully buffered DIMM (FBDIMM), a small outline DIMM (SODIMM), or the like. According to another embodiment, each of the plurality of memory channels 121, 122, ..., 12n may be any one of nonvolatile memory devices, such as flash memory, phase-change RAM (PRAM), magnetic RAM (MRAM), resistive RAM (RRAM), and ferroelectric RAM (FRAM).

The memory controller 110 may include a BIST circuit 112 configured to perform a test operation on the plurality of memory channels 121, 122, ..., 12n. The BIST circuit 112 may perform a test operation on the MCA in each of the plurality of memory channels 121, 122, ..., 12n. The BIST circuit 112 may provide test patterns for detecting defective cells in the MCAs. The test patterns may be configured to detect specific faults and structural defects and include various test vectors having a high fault coverage. For example, the test patterns may include random test patterns, pseudo-random test patterns, which are similar to the random test patterns but have a recurrent test vector sequence, or parallel bit test (PBT) patterns including the same data (e.g., "0" or "1").

In the shared BIST structure of FIG. 1, the memory controller 110 includes the BIST circuit 112 commonly connected to the plurality of memory channels 121, 122, ..., 12n via the shared bus 130. The plurality of memory channels 121, 122, ..., 12n may test the MCA in a corresponding memory channel under control by the BIST circuit 112. Accordingly, each of the plurality of memory channels 121, 122, ..., 12n may be tested based on a common test pattern provided by the BIST circuit 112. In the shared BIST structure, the operating performance of a memory cell of the MCA in each of the plurality of memory channels 121, 122, ..., 12n may be tested, but it may be difficult to detect a defect which may occur when performing a different operation for each memory channel.

Referring to FIG. 2, in the memory system 200, the plurality of memory channels 221, 222, . . . , 22n are connected to the memory controllers 211, 212, . . . , 21n via the individual buses 231, 232, . . . , 23n, respectively. The MCAs in the plurality of memory channels 221, 222, . . . , 22n may be tested based on different test patterns provided by BIST circuits 241, 242, . . . , 24n in the memory controllers 211, 212, . . . , 21n, respectively. Unfortunately, in the distributed BIST structure, a different operation for each memory channel may be tested, but an area occupied by the BIST circuits 241, 242, . . . , 24n may increase. In addition, because test unity on the plurality of memory channels 221, 222, . . . , 22n is not guaranteed, a test coverage may decrease.

Figure 3:
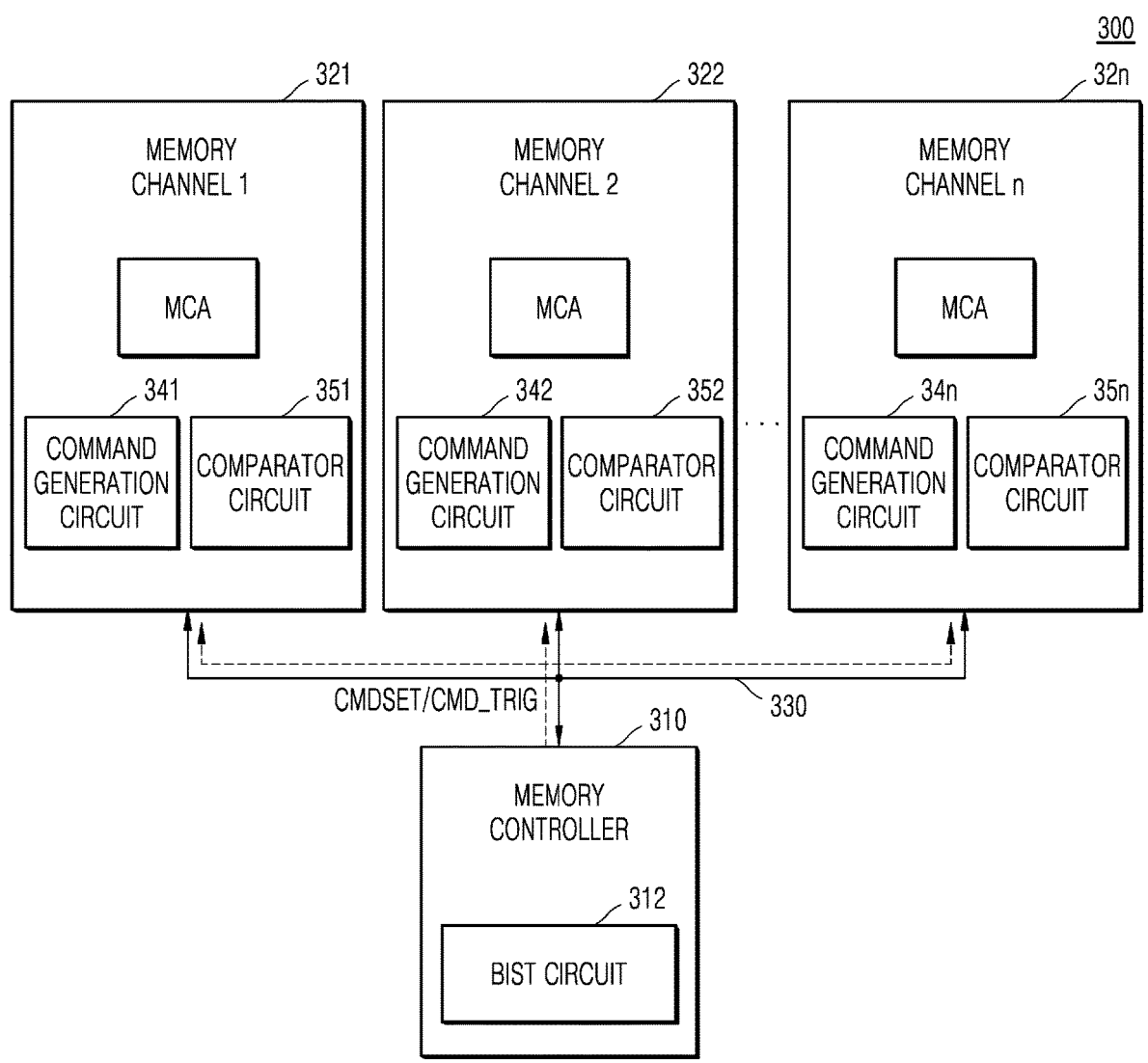
FIG. 3 is a block diagram illustrating a multi-channel memory system according to embodiments of the inventive concepts.

FIG. 3 is a block diagram illustrating a multi-channel memory system 300 according to embodiments. The memory system 300 of FIG. 3 may perform a test based on a different test pattern for each of a plurality of memory channels 321, 322, . . . , 32n by using a single BIST circuit 312 instead of the multiple BIST circuits illustrated in the memory systems 100 and 200 of FIGS. 1 and 2.

Referring to FIG. 3, similar to the memory system 100 of FIG. 1, the memory system 300 may have a shared BIST structure in which each of the plurality of memory channels 321, 322, . . . , 32n is connected to a memory controller 310 via a single bus 330. The plurality of memory channels 321, 322, . . . , 32n may include MCAs, command generation circuits 341, 342, . . . , 34n, and comparator circuits 351, 352, . . . , 35n, respectively.

The BIST circuit 312 in the memory controller 310 may include a command set CMDSET to be transferred to each of the plurality of memory channels 321, 322, . . . , 32n. The command set CMDSET may include different test patterns to be respectively used by the command generation circuits 341, 342, . . . , 34n. The test patterns may include random test patterns, pseudo-random test patterns, which are similar to the random test patterns but have a recurrent test vector sequence, or PBT patterns including the same data (e.g., "0" or "1").

The BIST circuit 312 may transfer the command set CMDSET to the command generation circuits 341, 342, . . . , 34n respectively in the plurality of memory channels 321, 322, . . . , 32n and transfer a command trigger signal CMD_TRG for driving the different test patterns included in the command set CMDSET to the command generation circuits 341, 342, . . . , 34n respectively in the plurality of memory channels 321, 322, . . . , 32n. In this case, the command trigger signal CMD_TRG may be transferred to the plurality of memory channels 321, 322, . . . , 32n at the same time.

According to some embodiments, the command set CMDSET transferred to each of the plurality of memory channels 321, 322, . . . , 32n may include the same test pattern to be used by each of the command generation circuits 341, 342, . . . , 34n. In this case, the BIST circuit 312 may sequentially transfer the command trigger signal CMD_TRG to each of the plurality of memory channels 321, 322, . . . , 32n at a time interval. Each of the plurality of memory channels 321, 322, . . . , 32n may drive the same test pattern according to relative timings of time points at which the command trigger signal CMD_TRG is transferred, thereby obtaining the same effect as being tested based on different test patterns.

The command generation circuits 341, 342, . . . , 34n in the plurality of memory channels 321, 322, . . . , 32n may store the command set CMDSET transferred from the BIST circuit 312. Each of the command generation circuits 341, 342, . . . , 34n may drive a test pattern included in the command set CMDSET, in response to the command trigger signal CMD_TRG transferred from the BIST circuit 312. Each of the plurality of memory channels 321, 322, . . . , 32n may test a memory cell of the MCA therein by using a different test pattern driven by each of the command generation circuits 341, 342, . . . , 34n. Alternatively, each of the plurality of memory channels 321, 322, . . . , 32n may test a memory cell of the MCA therein by using the same test pattern driven at a time interval by each of the command generation circuits 341, 342, . . . , 34n.

Each of the comparator circuits 351, 352, . . . , 35n in the plurality of memory channels 321, 322, . . . , 32n may output a test result of a corresponding memory channel. Each of the comparator circuits 351, 352, . . . , 35n may compare a test pattern stored in each of the command generation circuits 341, 342, . . . , 34n to data read from an MCA. As a result of the comparison, each of the comparator circuits 351, 352, . . . , 35n may detect one or more defective memory cells. Each of the comparator circuits 351, 352, . . . , 35n may be implemented by an exclusive OR (XOR) or exclusive NOR (XNOR) logic circuit. Each of the comparator circuits 351, 352, . . . , 35n may provide a defective address of a defective memory cell to the BIST circuit 312 in the memory controller 310 as a test result.

According to some embodiments, the BIST circuit 312 in the memory controller 310 may perform a repair operation on a defective address of each of the plurality of memory channels 321, 322, . . . , 32n. The BIST circuit 312 may perform a post package repair (PPR) operation to replace a defective word line selected by a defective address of a corresponding memory channel with a redundancy word line or replace a defective bit line selected by the defective address with a redundancy bit line.

In some embodiments, the memory controller 110 may perform a memory allocation operation by referring to respective test results of the plurality of memory channels 321, 322, . . . , 32n, which are provided to the BIST circuit 312. Accordingly, the memory controller 110 may process a function, usually known as a memory manager, of evenly distributing a memory area to processors or other virtual machines using the plurality of memory channels 321, 322, . . . , 32n.

Figure 4:
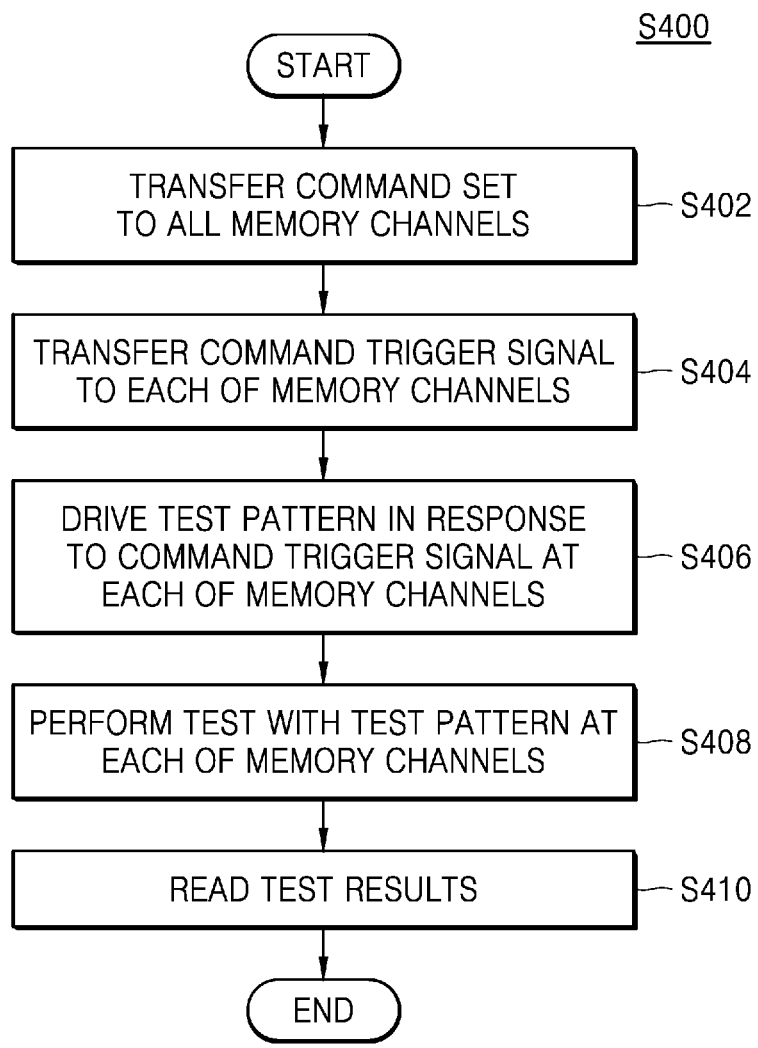
FIG. 4 is a flowchart illustrating a method of testing the memory system of FIG. 3.

FIG. 4 is a flowchart illustrating a method S400 of testing the memory system 300 of FIG. 3. Referring to FIGS. 3 and 4, in operation S402, the BIST circuit 312 in the memory controller 310 may transfer the command set CMDSET to all of the plurality of memory channels 321, 322, . . . , 32n. The command set CMDSET may be provided to set a test condition for each of the plurality of memory channels 321, 322, . . . , 32n. The command set CMDSET may include a test pattern to be used by the command generation circuits 341, 342, . . . , 34n respectively in the plurality of memory channels 321, 322, . . . , 32n. The test pattern may be configured to be different for each of the plurality of memory channels 321, 322, . . . , 32n. The command set CMDSET may be stored in the command generation circuits 341, 342, . . . , 34n respectively in the plurality of memory channels 321, 322, . . . , 32n.

In operation S404, the BIST circuit 312 in the memory controller 310 may transfer the command trigger signal CMD_TRG to each of the plurality of memory channels 321, 322, . . . , 32n. The command trigger signal CMD_TRG may be transferred to the plurality of memory channels 321, 322, . . . , 32n at the same time. According to an embodiment, the command trigger signal CMD_TRG may be sequentially provided to each of the plurality of memory channels 321, 322, . . . , 32n at a time interval. The command trigger signal CMD_TRG may be provided to the command generation circuits 341, 342, . . . , 34n respectively in the plurality of memory channels 321, 322, . . . , 32n.

In operation S406, each of the command generation circuits 341, 342, . . . , 34n in the plurality of memory channels 321, 322, . . . , 32n may drive the test pattern included in the command set CMDSET, in response to the command trigger signal CMD_TRG. The test pattern may include random test patterns, pseudo-random test patterns, which are similar to the random test patterns but have a recurrent test vector sequence, or PBT patterns including the same data (e.g., "0" or "1").

In operation S408, each of the plurality of memory channels 321, 322, . . . , 32n may perform a test operation the MCA therein by using the test pattern of operation S406. Each of the plurality of memory channels 321, 322, . . . , 32n may test a memory cell of the MCA therein by using a different test pattern.

In operation S410, the BIST circuit 312 in the memory controller 310 may read respective test results of the plurality of memory channels 321, 322, . . . , 32n. Each of the plurality of memory channels 321, 322, . . . , 32n may detect a defective memory cell of the MCA therein by using each of the comparator circuits 351, 352, . . . , 35n. A corresponding one of the comparator circuits 351, 352, . . . , 35n in a corresponding memory channel may detect the defective memory cell by comparing a test pattern stored in a corresponding one of the command generation circuits 341, 342, . . . , 34n to data read from a corresponding MCA. A defective address of the defective memory cell may be provided as a test result to the BIST circuit 312 in the memory controller 310. The BIST circuit 312 in the memory controller 310 may perform a repair operation on a defective address of each of the plurality of memory channels 321, 322, . . . , 32n.

Figure 5:
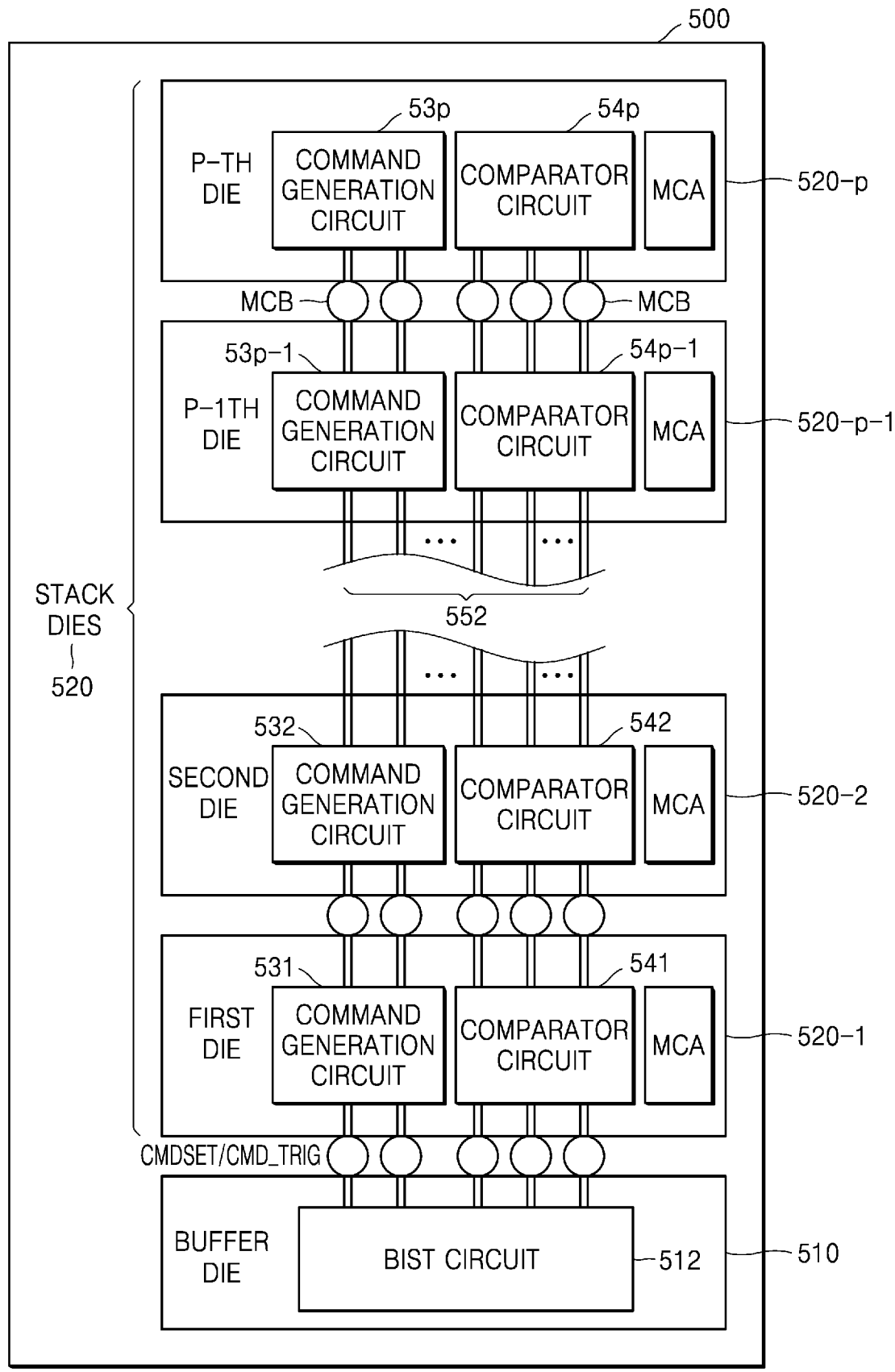
FIG. 5 is a block diagram illustrating a memory device of a stacked chip structure, according to embodiments of the inventive concepts.

FIG. 5 is a block diagram illustrating a memory device 500 of a stacked chip structure, according to embodiments. Referring to FIG. 5, the memory device 500 may provide, among other things, a test function, a fail analysis function, and/or a repair function by using the BIST circuit 512 in the stacked chip structure. The memory device 500 may include at least one buffer die 510 and a plurality of memory dies 520-1, 520-2, . . . , 520-p, which are stacked on the at least one buffer die 510 and exchange control signals and/or data with the at least one buffer die 510 via a plurality of through silicon via (TSV) lines 552. The plurality of TSV lines 552 may be electrically connected to micro bumps MCB formed between the plurality of memory dies 520-1, 520-2, . . . , 520-p. The plurality of memory dies 520-1, 520-2, . . . , 520-p may include MCAs, command generation circuits 531, 532, . . . , 53p, and comparator circuits 541, 542, . . . , 54p, respectively.

The at least one buffer die 510 may include the BIST circuit 512. The BIST circuit 512 may transfer, to each of the plurality of memory dies 520-1, 520-2, . . . , 520-p, the command set CMDSET and the command trigger signal CMD_TRG for driving a test pattern included in the command set CMDSET. The BIST circuit 512 may transfer the command trigger signal CMD_TRG to each of the plurality of memory dies 520-1, 520-2, . . . , 520-p at the same time or sequentially at a time interval.

The command generation circuits 531, 532, . . . , 53p respectively in the plurality of memory dies 520-1, 520-2, . . . , 520-p may store the command set CMDSET transferred from the BIST circuit 512. Each of the command generation circuits 531, 532, . . . , 53p may drive a test pattern included in the command set CMDSET, in response to the command trigger signal CMD_TRG transferred from the BIST circuit 312. Each of the plurality of memory dies 520-1, 520-2, . . . , 520-p may test a memory cell of the MCA therein by using a different test pattern driven by each of the command generation circuits 531, 532, . . . , 53p. Alternatively, each of the plurality of memory dies 520-1, 520-2, . . . , 520-p may test a memory cell of the MCA therein by using the same test pattern driven at a time interval by each of the command generation circuits 531, 532, . . . , 53p.

Each of the comparator circuits 541, 542, . . . , 54p in the plurality of memory dies 520-1, 520-2, . . . , 520-p may output a test result thereof. Each of the comparator circuits 541, 542, . . . , 54p may detect a defective memory cell by comparing a test pattern stored in each of the command generation circuits 531, 532, . . . , 53p to data read from the MCA. Each of the comparator circuits 541, 542, . . . , 54p may provide a defective address of the defective memory cell to the BIST circuit 512 in the at least one buffer die 510 as a test result.

Figure 6:
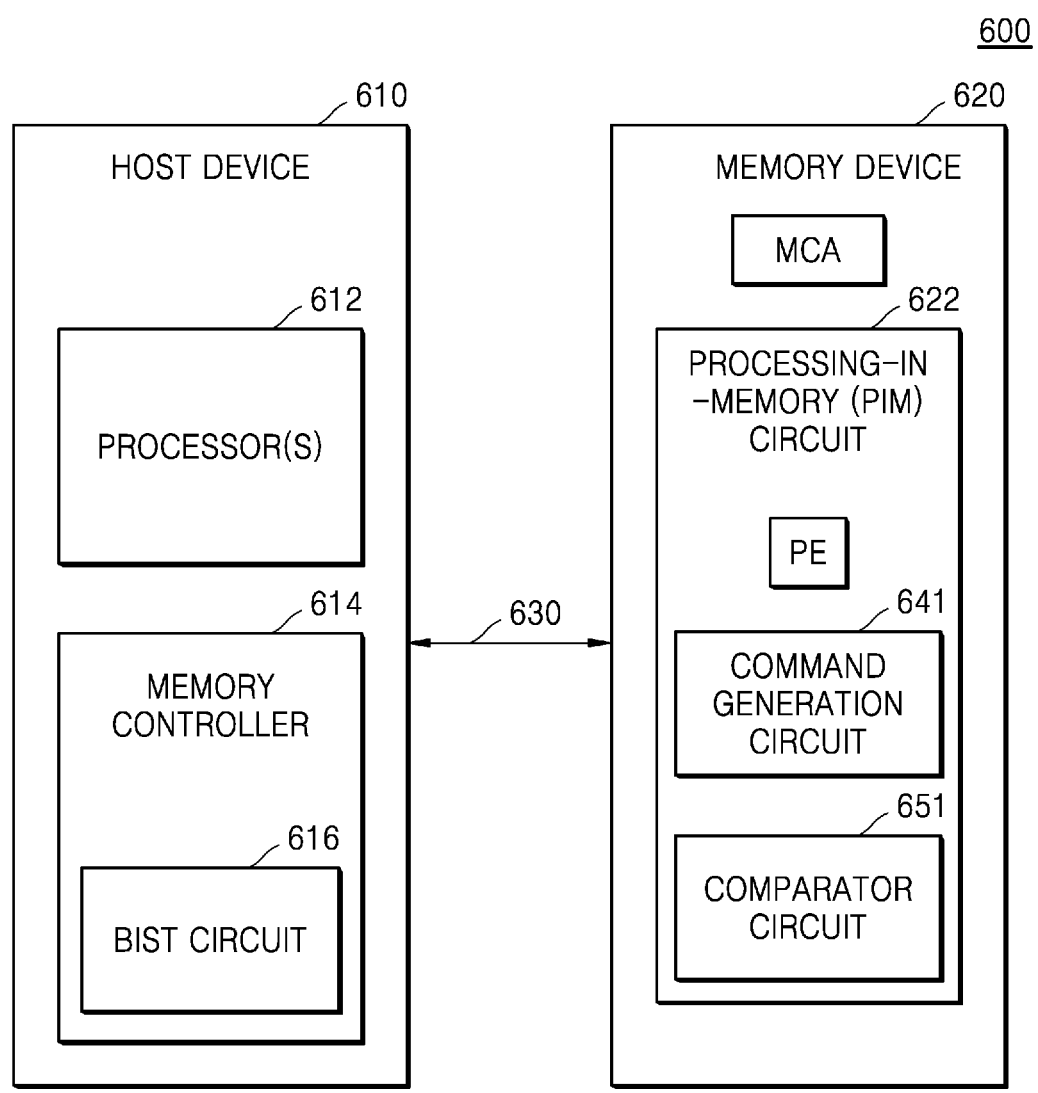
FIG. 6 is a block diagram illustrating a system including a memory device configured to perform an internal processing operation, according to embodiments of the inventive concepts.
Figure 7:
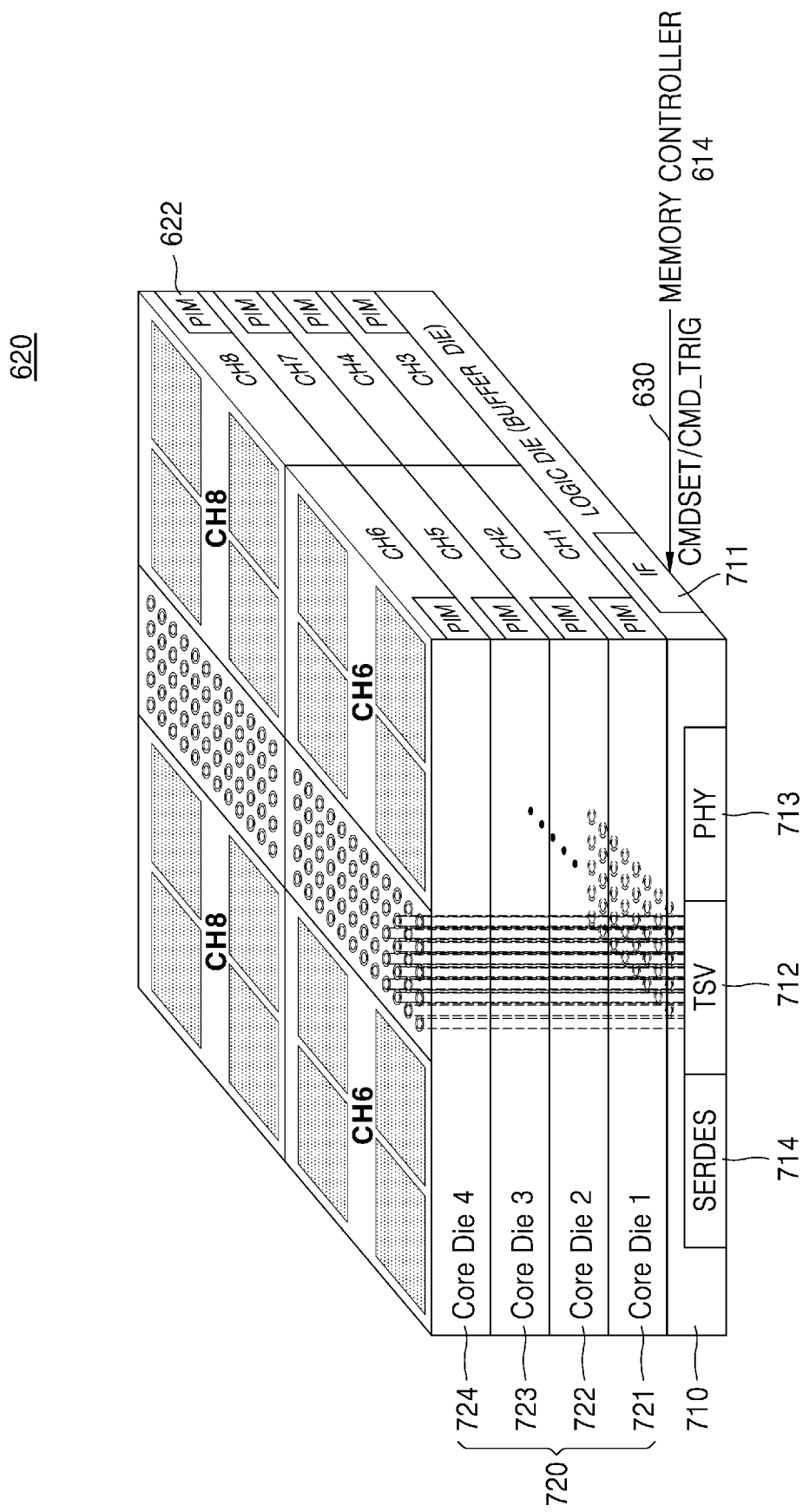
FIG. 7 illustrates an example in which the memory device of FIG. 6 is implemented as a high bandwidth memory (HBM)
Figure 8:
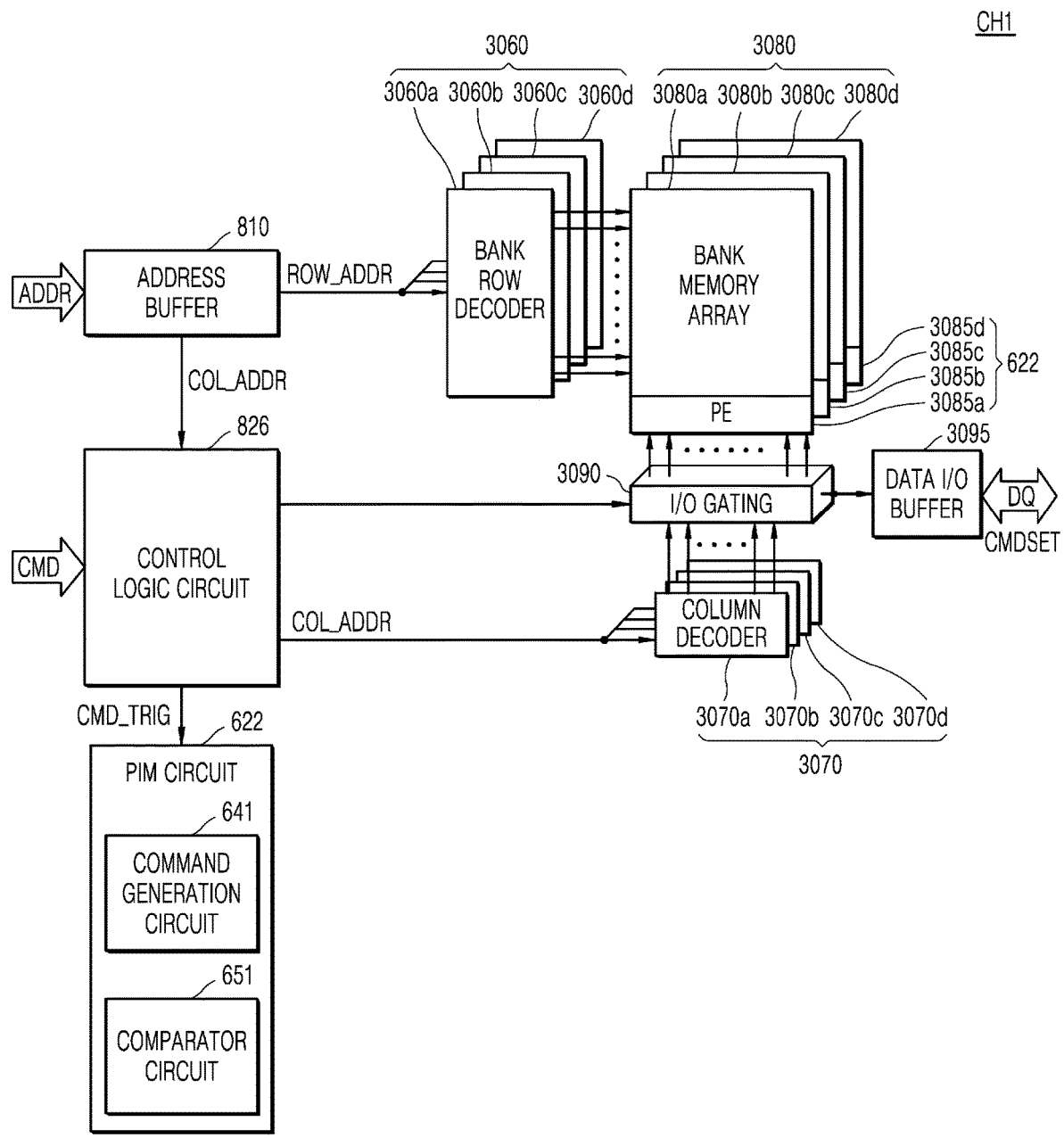
FIG. 8 is a block diagram illustrating a configuration of a first channel in the HBM of FIG. 7.

FIG. 6 is a block diagram illustrating a system 600 including a memory device 620 configured to perform an internal processing operation, according to embodiments. FIG. 7 illustrates an example in which the memory device 620 of FIG. 6 is implemented by an HBM, and FIG. 8 is a block diagram illustrating a configuration of a first channel CH1 representative among a plurality of channels CH1 to CH8 in the HBM of FIG. 7.

Referring to FIG. 6, the system 600 may be configured to execute applications, such as learning systems including a deep neural network, or applications, such as a high-performance computing operation and a graphic operation. These applications require a lot of computing and memory capabilities and put a high value on power efficiency and low latency, to cooperatively execute jobs or tasks in a parallel scheme, learn other data sets, and be trained at a high accuracy.

The system 600 may include a host device 610 and the memory device 620. The host device 610 may process an entire job or task by using a parallel processing approach in which the entire job or task is divided into smaller jobs to be executed in parallel by a lot of computing entities (e.g., processors, cores in the processors, and a processing-in-memory (PIM) circuit 622). A task includes a plurality of jobs configured in a hierarchical structure or the like, and a job may be referred to executable code supposed to be executed by a computing entity, data to be processed, or data to be retrieved from the memory device 620 by a computing entity, operated through execution of code, and then stored.

The host device 610 may be communicatively connected to the memory device 620 via a bus 630. The host device 610 may be a computing system, e.g., a computer, a laptop computer, a server, a workstation, a portable communication terminal, a personal digital assistant (PDA), a portable multimedia player (PMP), a smartphone, or a wearable device. Alternatively, the host device 610 may be some of components included in a computing system, such as a graphics card.

The host device 610 may include processor(s) 612 configured to perform a general computer operation in the system 600 and a memory controller 614 configured to manage data transmission/reception to/from the memory device 620. The processor(s) 612 is a primary component of the system 600 to process and manage instructions and mainly takes charge of execution of an operating system and applications. In addition, the processor(s) 612 distributes a work load to a plurality of computing entities for parallel processing to process a complicated job or task. The processor(s) 612 may include a central processing unit (CPU), a digital signal processor (DSP), a graphics processing unit (GPU), an encryption processing unit, a physics processing unit, a machine learning processing unit, and the like.

The processor(s) 612 may distribute execution of various computing tasks, instructions, or kernels to other processors or off-load the tasks, the instructions, or the kernels to the memory device 620, thereby improving efficiency. A kernel is defined as one or more instructions grouped to execute a task or a definable sub-task. An example in which the PIM circuit 622 in the memory device 620 performs a computing operation by using a kernel off-loaded by the processor(s) 612 is described. Various types of computing operations may be processed by the PIM circuit 622, and for example, at least some of neural network operations relating to artificial intelligence (AI) may be performed by the PIM circuit 622. For example, the processor(s) 612 may control the memory device 620 via the memory controller 614 so that the at least some of the neural network operations are performed by the PIM circuit 622.

The memory controller 614 may include a BIST circuit 616. The BIST circuit 616 may transfer, to the memory device 620, the command set CMDSET and the command trigger signal CMD_TRG for driving a test pattern included in the command set CMDSET. The BIST circuit 616 may transfer the command trigger signal CMD_TRG to the memory device 620 at the same time or sequentially at a time interval.

The memory device 620 may operate in any one operation mode among a normal mode and an internal processing mode. The normal mode indicates an operation mode of performing a general data transaction operation under control by the memory controller 614, and the internal processing mode indicates an operation mode of performing an internal processing operation under control by the memory controller 614. In the data transaction operation, the memory device 620 may perform a command and address reception operation and a data exchange operation according to normal mode timing parameters defined in a DDR and/or LPDDR protocol under control by the memory controller 614. In the internal processing operation, the memory device 620 may perform a command and address reception operation and a data exchange operation according to internal processing mode timing parameters defined in the DDR and/or LPDDR protocol under control by the memory controller 614. The normal mode timing parameters and the internal processing mode timing parameters may be set to be different from each other. According to an embodiment, the internal processing mode timing parameters may be set to relatively less values than the normal mode timing parameters.

The memory device 620 may include an MCA and the PIM circuit 622. The PIM circuit 622 may include at least one processing element (PE) configured to execute a kernel off-loaded by the host device 610. The PIM circuit 622 is hardware having a processing function similar to the processor(s) 612 included in the host device 610. When the PIM circuit 622 is called an internal processor, the term "internal" indicates the presence in the memory device 620. Therefore, a processor existing "outside" the memory device 620 may be called, for example, the processor(s) 612 in the host device 610.

The PIM circuit 622 may include a command generation circuit 641 and a comparator circuit 651. The command generation circuit 641 may be included in a PIM command converter and store the command set CMDSET transferred from the BIST circuit 616. The command generation circuit 641 may drive the test pattern included in the command set CMDSET, in response to the command trigger signal CMD_TRG transferred from the BIST circuit 616. The memory device 620 may test a memory cell in the MCA by using the test pattern driven by the command generation circuit 641.

In some embodiments, the PIM command converter may convert a command received through a command/address signal line of the bus 630 into an internal processing operation command. For example, the PIM command converter may convert the command received through the command/address signal line into the internal processing operation command indicating an internal processing operation type (e.g., data search, data add, data move, data invert, data shift, data swap, data compare, logic operations, or data processing/computations). The internal processing operation command may include an internal processing read command and/or an internal processing write command associated with an internal processing operation.

The comparator circuit 651 may output a test result of the memory device 620. The comparator circuit 651 may detect a defective memory cell by comparing the test pattern stored in the command generation circuit 641 to data read from the MCA. The comparator circuit 651 may provide a defective address of the defective memory cell to the BIST circuit 616 in the memory controller 614 as the test result. The BIST circuit 616 in the memory controller 614 may perform a repair operation on the defective address by referring to the test result of the memory device 620.

FIG. 7 illustrates an example in which the memory device 620 of FIG. 6 is implemented by an HBM. The HBM configuration shown in FIG. 7 is only illustrative and is not necessarily a real HBM configuration. In addition, the illustrative HBM configuration shown in FIG. 7 does not indicate or imply constraints on the inventive concept. Hereinafter, for convenience of description, the memory device 620 may be replaced by an HBM 620.

Referring to FIGS. 6 and 7, the HBM 620 may be connected to the host device 610 based on an HBM protocol of the Joint Electron Device Engineering Council (JEDEC) standard. The HBM protocol is a high-performance RAM interface for three-dimensional stack memories (e.g., DRAM). The HBM 620 generally achieves a wider bandwidth while consuming less power at a substantially less form factor than other DRAM technologies (e.g., DDR4, GDDR5, and the like).

The HBM 620 may have a wide bandwidth with a plurality of channels, e.g., first to eighth channels CH1 to CH8, having independent interfaces. The HBM 620 may include a plurality of dies 710 and 720, e.g., a logic die (or buffer die) 710 and one or more core dies 720 stacked on the logic die 710. Although FIG. 7 shows an example in which first to fourth core dies 721 to 724 are included in the HBM 620, the number of core dies 720 may be variously changed. The core dies 720 may be referred to as memory dies.

Each of the first to fourth core dies 721 to 724 may include one or more channels. FIG. 7 shows that each of the first to fourth core dies 721 to 724 includes two channels so that the HBM 620 has eight channels CH1 to CH8. For example, the first core die 721 may include the first and third channels CH1 and CH3, the second core die 722 may include the second and fourth channels CH2 and CH4, the third core die 723 may include the fifth and seventh channels CH5 and CH7, and the fourth core die 724 may include the sixth and eighth channels CH6 and CH8.

The logic die 710 may include an interface circuit 711 configured to communicate with the memory controller 614, and receive a command/address, data, the command set CMDSET, and/or the command trigger signal CMD_TRG from the memory controller 614 via the interface circuit 711. The BIST circuit 616 in the memory controller 614 may transfer a command/address, data, the command set CMDSET, and/or the command trigger signal CMD_TRG via the bus 630 arranged in correspondence to the first to eighth channels CH1 to CH8, and the bus 630 may be discriminatively formed for each channel, or a portion of the bus 630 may be shared by at least two channels. The interface circuit 711 may transfer a command/address and data to a channel which the memory controller 614 requests for a memory operation or computation processing. In addition, the interface circuit 711 may transfer, to all of the first to eighth channels CH1 to CH8, the command set CMDSET including a test pattern, which the BIST circuit 616 in the memory controller 614 provides for testing the first to eighth channels CH1 to CH8, and the command trigger signal CMD_TRG for driving the test pattern. According to an embodiment, each of the core dies 720 or each of the first to eighth channels CH1 to CH8 may include the PIM circuit 622.

The host device 610 may provide a command/address and data so that at least some of a plurality of computation tasks or kernels are performed by the HBM 620, and computation processing may be performed by the PIM circuit 622 in a channel designated by the host device 610. Each of the first to eighth channels CH1 to CH8 may include a plurality of banks, and the PIM circuit 622 in each channel may include one or more PEs. For example, in each channel, the number of PEs may be the same as the number of banks, or the number of PEs may be less than the number of banks such that one PE is shared by at least two banks. The PIM circuit 622 in each channel may execute a kernel off-loaded by the host device 610.

The logic die 710 may further include a TSV region 712, an HBM physical layer interface (HBM PHY) region 713, and a serializer/deserializer (SERDES) region 714. The TSV region 712 is a region in which TSVs for communicating with the core dies 720 are formed, and is a region in which the bus 630 arranged in correspondence to the first to eighth channels CH1 to CH8 is formed. When each of the first to eighth channels CH1 to CH8 has a 128-bit bandwidth, the TSVs may include configurations for inputting and outputting 1024-bit data.

The HBM PHY region 713 may include a plurality of I/O circuits for communication between the memory controller 614 and the first to eighth channels CH1 to CH8 and, for example, the HBM PHY region 713 may include one or more interconnect circuits configured to connect the memory controller 614 to the first to eighth channels CH1 to CH8. The HBM PHY region 713 may include a physical or electrical layer and a logical layer provided for signals, a frequency, timing, driving, detailed operational parameters, and functionality required for efficient communication between the memory controller 614 and the first to eighth channels CH1 to CH8. The HBM PHY region 713 may perform memory interfacing with a corresponding channel, such as selecting a row and a column corresponding to a memory cell, writing data in a memory cell, or reading written data. The HBM PHY region 713 may support features of the HBM protocol of the JEDEC standard.

The SERDES region 714 is a region in which a SERDES interface of the JEDEC standard is provided in response to an increase in the processing throughput of the processor(s) 612 in the host device 610 and an increase in demands for a memory bandwidth. The SERDES region 714 may include a SERDES transmitter portion, a SERDES receiver portion, and a controller portion. The SERDES transmitter portion may include a parallel-to-serial circuit and a transmitter, receive a parallel data stream, and serialize the received parallel data stream. The SERDES receiver portion may include a receiver amplifier, an equalizer, a clock and data reconstruction circuit, and a serial-to-parallel circuit, receive a serial data stream, and parallelize the received serial data stream. The controller portion may include an error detection circuit, an error correction circuit, and registers, such as first in first out (FIFO).

FIG. 8 representatively illustrates a configuration of the first channel CH1 among the first to eighth channels CH1 to CH8 in the HBM 620 of FIG. 7. The configuration of the first channel CH1 may be applied to the other channels, i.e., the second to eighth channels CH2 to CH8, in the same manner.

Referring to FIG. 8, the first channel CH1 may include an address buffer 810, a control logic circuit 826, the PIM circuit 622, a row decoder 3060, a column decoder 3070, an MCA 3080, an I/O gating circuit 3090, and a data I/O buffer 3095. Although not shown in FIG. 8, the first channel CH1 may further include a clock buffer, a command decoder, a mode register, a refresh control circuit, a voltage generation circuit, a bank control logic, and the like.

The MCA 3080 may include first to fourth bank arrays 3080a, 3080b, 3080c, and 3080d. Each of the first to fourth bank arrays 3080a, 3080b, 3080c, and 3080d may include a plurality of word lines, a plurality of bit lines, and a plurality of memory cells formed at points at which the plurality of word lines intersect with the plurality of bit lines.

The row decoder 3060 may include first to fourth bank row decoders 3060a, 3060b, 3060c, and 3060d respectively connected to the first to fourth bank arrays 3080a, 3080b, 3080c, and 3080d, the column decoder 3070 may include first to fourth bank column decoders 3070a, 3070b, 3070c, and 3070d respectively connected to the first to fourth bank arrays 3080a, 3080b, 3080c, and 3080d, and the PIM circuit 622 may include first to fourth PEs 3085a, 3085b, 3085c, and 3085d respectively connected to the first to fourth bank arrays 3080a, 3080b, 3080c, and 3080d.

The first to fourth bank arrays 3080a, 3080b, 3080c, and 3080d, the first to fourth bank row decoders 3060a, 3060b, 3060c, and 3060d, the first to fourth bank column decoders 3070a, 3070b, 3070c, and 3070d, and the first to fourth PEs 3085a, 3085b, 3085c, and 3085d may constitute first to fourth memory banks, respectively. Although the present embodiment shows an example of the first channel CH1 including four memory banks, the first channel CH1 may include additional memory banks according to additional embodiments.

The control logic circuit 826 may control a general operation of the first channel CH1. The control logic circuit 826 may generate control signals so that the first channel CH1 performs a write operation, a read operation, and/or a refresh operation. The control logic circuit 826 may include a command decoder configured to decode a command CMD received from the memory controller 614, and a mode register configured to set a plurality of operation options of the first channel CH1. The control logic circuit 826 may receive the command trigger signal CMD_TRG transferred from the BIST circuit 616 in the memory controller 614 and provide the command trigger signal CMD_TRG to the PIM circuit 622. The mode register may be used to control, for example, a burst length, a read/write latency, a preamble/postamble length, pre-emphasis, reference voltage setting, and the like. The burst length may be provided to set a maximum number of column locations accessible in response to a read and/or write command. The read/write latency may be provided to define a clock cycle delay between a read and/or write command and a first bit of valid output and/or input data.

The address buffer 810 may receive an address ADDR including a row address ROW ADDR and a column address COL_ADDR from the memory controller 614. In addition, the address buffer 810 may receive a bank address and provide the received bank address to the bank control logic, provide the received row address ROW ADDR to the row decoder 3060, and provide the received column address COL_ADDR to the control logic circuit 826. The bank control logic may generate bank control signals in response to the bank address. In response to the bank control signals, a bank row decoder among the first to fourth bank row decoders 3060a, 3060b, 3060c, and 3060d, which corresponds to the bank address, may be activated, and a bank column decoder among the first to fourth bank column decoders 3070a, 3070b, 3070c, and 3070d, which corresponds to the bank address, may be activated.

The I/O gating circuit 3090 may include, in addition to circuits configured to gate I/O data DQ, a column select circuit, an input data mask logic, read data latches configured to store read data output from the first to fourth bank arrays 3080a, 3080b, 3080c, and 3080d, and a write driver configured to write data in the first to fourth bank arrays 3080a, 3080b, 3080c, and 3080d.

Read data output from one bank array among the first to fourth bank arrays 3080a, 3080b, 3080c, and 3080d may be sensed by sense amplifiers corresponding to the one bank array and stored in the read data latches. Write data to be written in an MCA of one bank array among the first to fourth bank arrays 3080a, 3080b, 3080c, and 3080d may be provided from the memory controller 614 to the data I/O buffer 3095. The write data provided to the data I/O buffer 3095 may be written in the one bank array via the write driver. The command set CMDSET provided from the BIST circuit 616 in the memory controller 614 may be received via the data I/O buffer 3095. The command set CMDSET may be provided to the PIM circuit 622.

The PIM circuit 622 may include the command generation circuit 641 and the comparator circuit 651. The command generation circuit 641 may convert the command CMD received by the control logic circuit 826 into an internal processing operation command. The command generation circuit 641 may store the command set CMDSET transferred from the BIST circuit 616. The command generation circuit 641 may drive the test pattern included in the command set CMDSET, in response to the command trigger signal CMD_TRG transferred from the BIST circuit 616. The memory device 620 may test a memory cell in the MCA 3080 by using the test pattern driven by the command generation circuit 641.

The comparator circuit 651 may output a test result of the MCA 3080. The comparator circuit 651 may detect a defective memory cell by comparing the test pattern stored in the command generation circuit 641 to data read from the MCA 3080. The comparator circuit 651 may provide a defective address of the defective memory cell to the BIST circuit 616 in the memory controller 614 as the test result. The BIST circuit 616 in the memory controller 614 may perform a repair operation on the defective address by referring to the test result of the memory device 620.

Figure 9:
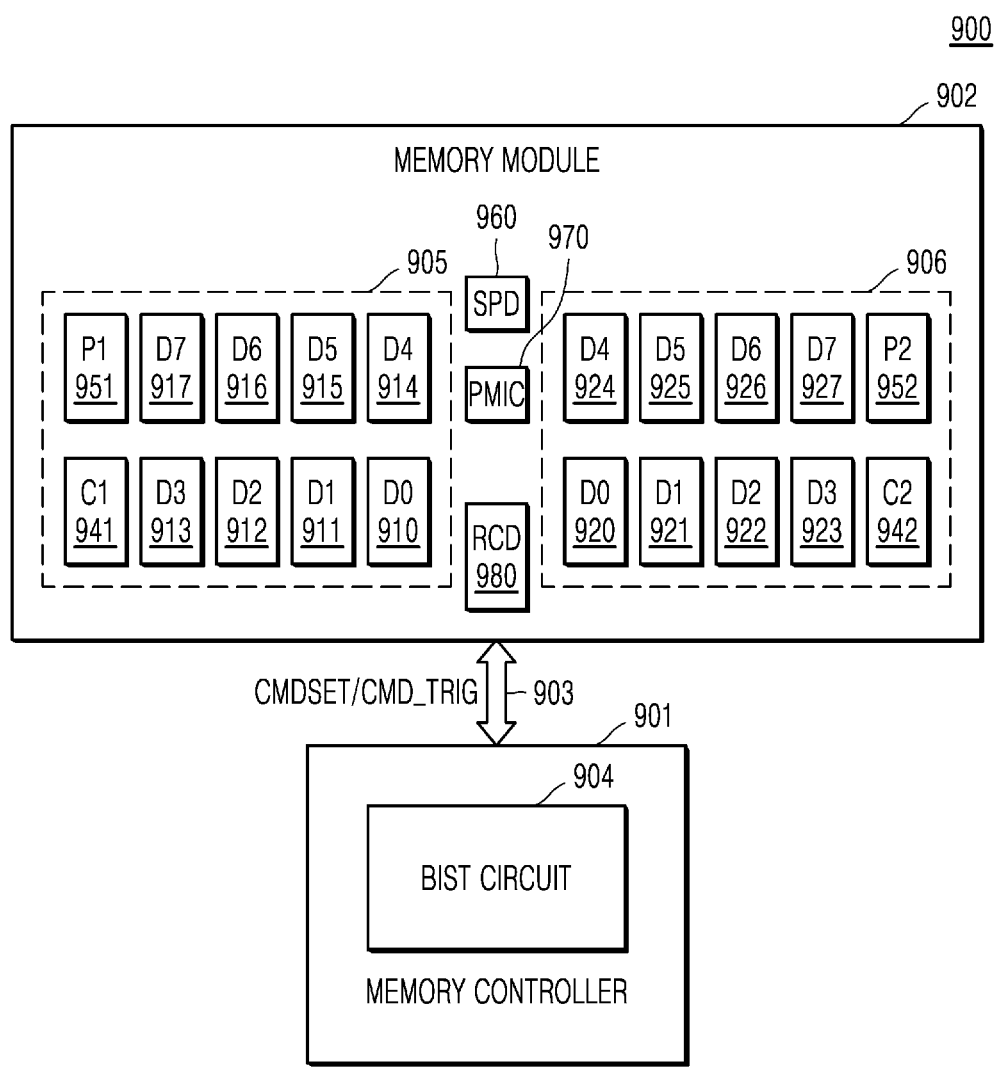
FIG. 9 is a block diagram illustrating a memory system including a memory module, according to embodiments of the inventive concepts.

FIG. 9 is a block diagram illustrating a memory system 900 including a memory module 902, according to embodiments. Referring to FIG. 9, the memory system 900 may include the memory module 902 and a memory controller 901. The memory module 902 shows one memory rank implemented by a double data rate synchronous dynamic random-access memory dual in-line memory module (DDR DIMM).

The memory module 902 of FIG. 9 may include two memory channels, e.g., first and second memory channels 905 and 906, for each memory rank. Each of the first and second memory channels 905 and 906 may include exclusive eight data chips storing data therein, one error correction code (ECC) chip, and one error detection code chip (hereinafter, cyclic redundancy check (CRC) chip). Error detection code may include CRC. For convenience of description, the error detection code may be replaced by CRC code. The first memory channel 905 may include eight data chips 910 to 917, a CRC chip 941, and an ECC chip 951. The second memory channel 906 may include eight data chips 920 to 927, a CRC chip 942, and an ECC chip 952.

The memory module 902 may further include a serial presence detect (SPD) chip 960, a power management integrated circuit (PMIC) chip 970, and a register clock driver (RCD) chip 980. The SPD chip 960 may include device information of the memory module 902. For example, the SPD chip 960 may include initial information or device information, such as a module form, a module configuration, a storage capacity, a module type, and an execution environment, of the memory module 902.

When the memory system 900 is booted, the memory controller 901 may read the device information from the SPD chip 960 in the memory module 902 and recognize the memory module 902 based on the read device information. The memory controller 901 may control the memory module 902 based on the device information from the SPD chip 960. The PMIC chip 970 may generate a power source voltage based on an input voltage and provide the generated power source voltage to memory chips, e.g., the data chips 910 to 917 and 920 to 927, the CRC chips 941 and 942, and the ECC chips 951 and 952. The memory chips 910 to 917, 920 to 927, 941 942, 951, and 952 may operate based on the power source voltage.

The RCD chip 980 may control the memory chips 910 to 917, 920 to 927, 941 942, 951, and 952, the SPD chip 960, and the PMIC chip 970 under control by the memory controller 901. For example, the RCD chip 980 may receive a command, an address, a clock signal, and a control signal from the memory controller 901 via a memory bus 903 and perform a buffer function of distributing the received signals to the first memory channel 905 and the second memory channel 906. The memory chips 910 to 917, 920 to 927, 941 942, 951, and 952 in the first and second memory channels 905 and 906 may exchange data with the memory controller 901 in response to the command, the address, the clock signal, and the control signal provided from the RCD chip 980.

The memory controller 901 may include a BIST circuit 904. The BIST circuit 904 may transfer, to the memory module 902, the command set CMDSET and the command trigger signal CMD_TRG for driving a test pattern included in the command set CMDSET. The BIST circuit 904 may transfer the command trigger signal CMD_TRG to the memory module 902 at the same time or sequentially at a time interval.

Each of the first and second memory channels 905 and 906 includes the exclusive eight data chips 910 to 917 or 920 to 927 storing data therein, and each of the data chips 910 to 917 and 920 to 927 may include an MCA, a command generation circuit, and a comparator circuit as described with reference to FIGS. 3 and 4. The RCD chip 980 may provide the command set CMDSET and the command trigger signal CMD_TRG transferred from the BIST circuit 904 in the memory controller 901 to the data chips 910 to 917 and 920 to 927 in the first and second memory channels 905 and 906. The command generation circuit in each of the data chips 910 to 917 and 920 to 927 may store the command set CMDSET transferred from the BIST circuit 904 and drive a test pattern included in the command set CMDSET, in response to the command trigger signal CMD_TRG transferred from the BIST circuit 904. The BIST circuit 904 may transfer the command trigger signal CMD_TRG to each of the data chips 910 to 917 and 920 to 927 at the same time or sequentially at a time interval. Each of the data chips 910 to 917 and 920 to 927 in the first and second memory channels 905 and 906 may test a memory cell in the MCA by using the test pattern driven by the command generation circuit.

The comparator circuit in each of the data chips 910 to 917 and 920 to 927 in the first and second memory channels 905 and 906 may output a test result of a corresponding data chip. The comparator circuit may detect a defective memory cell by comparing the test pattern stored in the command generation circuit to data read from the MCA. The comparator circuit may provide a defective address of the defective memory cell to the BIST circuit 904 in the memory controller 901 as the test result. The BIST circuit 904 may perform a repair operation on the defective address of each of the data chips 910 to 917 and 920 to 927.

As described above, the memory system 900 may test the first and second memory channels 905 and 906 based on different test patterns, respectively, by using the BIST circuit 904, thereby reducing a chip area of the memory system 900 and improving the performance and reliability of the memory system 900.

Figure 10:
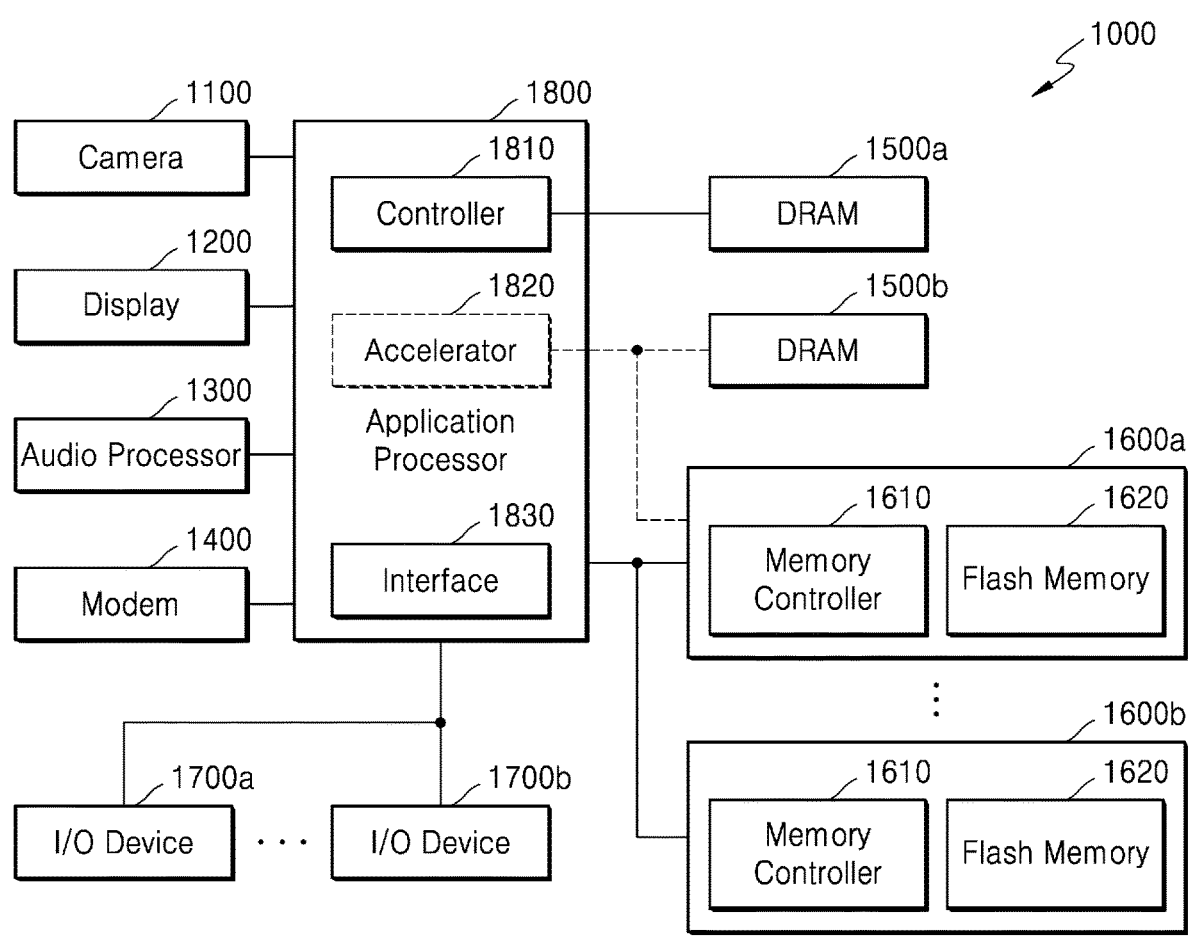
FIG. 10 is a block diagram illustrating a system to which a method of testing a memory system having multiple channels is applied, according to embodiments of the inventive concepts.

FIG. 10 is a block diagram illustrating a system 1000 to which a method of testing a memory system having multiple channels is applied, according to embodiments. Referring to FIG. 10, the system 1000 may include a camera 1100, a display 1200, an audio processor 1300, a modem 1400, DRAMs 1500a and 1500b, flash memory devices 1600a and 1600b, I/O devices 1700a and 1700b, and an application processor (AP) 1800. The system 1000 may be implemented by a laptop computer, a mobile phone, a smartphone, a tablet personal computer (PC), a wearable device, a healthcare device, or an Internet of Things (IoT) device. Alternatively, the system 1000 may be implemented by a server or a PC.

The camera 1100 may capture a still image or a video and store the captured image/video data or transfer same to the display 1200, under control by a user. The audio processor 1300 may process audio data included in content in the flash memory devices 1600a and 1600b or a network. The modem 1400 may modulate and transmit a signal for wired/wireless data transmission and reception and perform demodulation to restore an original signal at a reception side. The I/O devices 1700a and 1700b may include devices configured to provide digital input and/output functions, such as a universal serial bus (USB), a storage, a digital camera, a secure digital (SD) card, a digital versatile disc (DVD), a network adapter, and a touch screen.

The AP 1800 may control a general operation of the system 1000. The AP 1800 may control the display 1200 to display, on the display 1200, a portion of content stored in the flash memory devices 1600a and 1600b. Upon receiving a user input via the I/O devices 1700a and 1700b, the AP 1800 may perform a control operation corresponding to the user input. The AP 1800 may include an accelerator block, which is an exclusive circuit for AI data computation, or an accelerator chip 1820 may be provided separately from the AP 1800. The DRAM 1500b may be additionally mounted in the accelerator block or the accelerator chip 1820. The accelerator block is a functional block configured to professionally perform a particular function of the AP 1800 and may include a GPU, which is a functional block configured to professionally process graphic data, a neural processing unit (NPU), which is a functional block configured to professionally perform AI calculation and inference, and a data processing unit (DPU), which is a functional block configured to professionally transmit data.

The system 1000 may include a greater number of the DRAMs 1500a and 1500b. The AP 1800 may control the DRAMs 1500a and 1500b based on a command and mode register setting (MRS) fit to a JEDEC standard specification or perform communication by setting a DRAM interface protocol to use manufacturer unique functions, such as low voltage/high speed/reliability, and a CRC/ECC function. For example, the AP 1800 may communicate with the DRAM 1500a via an interface fit to a JEDEC standard specification, such as LPDDR4 or LPDDR5, and the accelerator block or the accelerator chip 1820 may communicate with the DRAM 1500b by setting a novel DRAM interface protocol to control the DRAM 1500b for an accelerator, which has a higher bandwidth than the DRAM 1500a.

Although FIG. 10 shows only the DRAMs 1500a and 1500b, the present embodiment is not limited thereto, and any memory, such as PRAM, SRAM, MRAM, RRAM, FRAM, or hybrid RAM, may be used only if a bandwidth, a responding speed, and a voltage condition of the AP 1800 or the accelerator chip 1820 are satisfied. The DRAMs 1500a and 1500b have a relatively less latency and bandwidth than the I/O devices 1700a and 1700b and the flash memory devices 1600a and 1600b. The DRAMs 1500a and 1500b may be initialized at a power-on time point of the system 1000, used as a temporary storage in which an operating system and application data are loaded, or used as an execution space of various kinds of software code.

In the DRAMs 1500a and 1500b, the four fundamental arithmetic operations of addition, subtraction, multiplication, and division, a vector operation, an address operation, or a fast Fourier transform (FFT) operation may be performed. In addition, in the DRAMs 1500a and 1500b, a function used for inference may be performed. Herein, inference may be performed by a deep learning algorithm using an artificial neural network. The deep learning algorithm may include a training operation of training a model based on various pieces of data and an inference operation of recognizing data by using the trained model. In an embodiment, an image captured by the user using the camera 1100 may be signal-processed and stored in the DRAM 1500b, and the accelerator block or the accelerator chip 1820 may perform an AI data computation to recognize data by using data stored in the DRAM 1500b and a function used for inference.

The system 1000 may include a plurality of storages or the flash memory devices 1600a and 1600b having a larger capacity than the DRAMs 1500a and 1500b. The accelerator block or the accelerator chip 1820 may perform the training operation and the AI data computation by using the flash memory devices 1600a and 1600b. In an embodiment, each of the flash memory devices 1600a and 1600b may efficiently perform the training operation and the AI data computation, which the AP 1800 and/or the accelerator chip

1820 performs, by using a computing device in a memory controller 1610. The flash memory devices 1600*a* and 1600*b* may store pictures taken through the camera 1100 or store data received over a data network. For example, the flash memory devices 1600*a* and 1600*b* may store augmented reality/virtual reality content, high definition (HD) content, or ultra-high definition (UHD) content.

In the system 1000, the DRAMs 1500*a* and 1500*b* may partially or entirely combine the embodiments described withe reference to FIGS. 3 to 9. The DRAMs 1500*a* and 1500*b* may include a plurality of memory channels and include a command generation circuit and a comparator circuit for each memory channel. A controller 1810 in the AP 1800 may include a BIST circuit, and the BIST circuit may transfer, to the DRAMs 1500*a* and 1500*b*, a command set and a command trigger signal for driving a test pattern included in the command set. The BIST circuit may transfer the command trigger signal to the plurality of memory channels in the DRAMs 1500*a* and 1500*b* at the same time or sequentially at a time interval. The command generation circuit in each memory channel may store the command set transferred from the BIST circuit and drive the test pattern included in the command set in response to the command trigger signal transferred from the BIST circuit. Each memory channel may test a memory cell in an MCA by using a different test pattern driven by the command generation circuit, thereby reducing a chip area of a memory system and improving the performance and reliability of the memory system.

While the inventive concepts have been particularly shown and described with reference to embodiments thereof, it will be understood that various changes in form and details may be made therein without departing from the spirit and scope of the following claims.

What is claimed is:

1. A memory system, comprising:
a plurality of memory devices having respective arrays of memory cells therein;
a bus electrically coupled to and shared by the plurality of memory devices; and
a memory controller electrically coupled by the bus to the plurality of memory devices, said memory controller comprising a built-in self-test (BIST) circuit, which is configured to transfer a respective command set including a respective at least one test pattern to each of the plurality of memory devices via the bus, and transfer a command trigger signal for driving the respective at least one test pattern to each of the plurality of memory devices via the bus; and
wherein each of the plurality of memory devices comprises a respective command generation circuit, which is configured to store the respective command set received from said BIST circuit and test a corresponding memory cell array based on the respective at least one test pattern, in response to the command trigger signal.

2. The memory system of claim 1, wherein each of the plurality of memory devices further comprises a comparator circuit, which is configured to detect a defective memory cell by: (i) comparing the respective at least one test pattern stored in the command generation circuit to data read from the corresponding memory cell array, and (ii) transferring a defective address of the defective memory cell to the BIST circuit as a test result.

3. The memory system of claim 2, wherein the BIST circuit is further configured to perform a repair operation on the defective address by using redundancy cells within the corresponding memory cell array.

4. The memory system of claim 1, wherein the BIST circuit is further configured to transfer the command trigger signal concurrently to the plurality of memory devices when the respective at least one test patterns stored within the command generation circuits within the plurality of memory devices are different.

5. The memory system of claim 1, wherein the BIST circuit is further configured to sequentially transfer the command trigger signal to each of the plurality of memory devices when the respective at least one test patterns stored within the command generation circuits within the plurality of memory devices are equivalent.

6. The memory system of claim 1, wherein the plurality of memory devices include at least a first memory channel and a second channel; and wherein the first memory channel and the second channel are tested by the BIST circuit using respective ones of the at least one test pattern, which are different from each other.

7. The memory system of claim 1, wherein each of the plurality of memory devices comprises a processing-in-memory (PIM) circuit having a processing function, said PIM circuit comprising a PIM command converter, which is configured to convert a command received by each of the plurality of memory devices into an internal processing operation command; and wherein the command generation circuit is included within the PIM circuit.

8. A memory device, comprising:
a first memory channel coupled to a first memory die;
a second memory channel coupled to a second memory die; and
a buffer die configured to interface with the first and second memory dies via the first and second memory channels, with each of the first and second memory dies being stacked on the buffer die and comprising respective arrays of memory cells therein, said buffer comprising a built-in self-test (BIST) circuit, which is: (i) electrically coupled in common to the first and second memory channels, and (ii) configured to transfer a command set including a respective test pattern to the first and second memory dies via the first and second memory channels and transfer a command trigger signal for driving the respective test pattern to the first and second memory dies via the first and second memory channels; and
wherein each of the first and second memory dies comprises a respective command generation circuit, which is configured to store the command set and test the corresponding memory cell array based on the respective test pattern, in response to the command trigger signal.

9. The memory device of claim 8, wherein each of the first and second memory dies further comprises a respective comparator circuit, which is configured to detect a defective memory cell by comparing the respective test pattern stored in the corresponding command generation circuit to data read from the corresponding memory cell array and transfer a defective address of the defective memory cell to the BIST circuit as a test result.

10. The memory device of claim 9, wherein the BIST circuit is further configured to perform a repair operation on the defective address by using redundancy cells of the corresponding memory cell array in each of the first and second memory dies.

11. The memory device of claim 8, wherein the BIST circuit is further configured to transfer the command trigger signal concurrently to the first and second memory dies when transferring the command set including respective test patterns, which are different from each other, to the first and second memory dies, respectively.

12. The memory device of claim 8, wherein the BIST circuit is further configured to transfer the command trigger signal to the first and second memory dies in sequence, when the respective test patterns associated with the first and second memory dies are equivalent.

13. The memory device of claim 8, wherein each of the first and second memory dies comprises a processing-in-memory (PIM) circuit having a processing function, said PIM circuit comprising a PIM command converter configured to convert a command received by each of the first and second memory dies into an internal processing operation command; and wherein each command generation circuit associated with the first and second memory dies is included within a respective PIM circuit.

14. A method of testing first and second memory channels comprising respective memory cell arrays therein, using a built-in self-test (BIST) circuit commonly connected to at least the first and second memory channels, said method comprising:
  transferring a command set including a respective test pattern to the first and second memory channels via the BIST circuit;
  transferring a command trigger signal for driving the respective test patterns to the first and second memory channels via the BIST circuit;
  testing each of the first and second memory channels using the respective test patterns, which are different from each other, in response to the command trigger signal;
  comparing the respective test pattern to data read from the respective memory cell array, in each of the first and second memory channels;
  detecting a defective memory cell of the memory cell array in each of the first and second memory channels; and
  transferring a defective address of the defective memory cell in each of the first and second memory channels to the BIST circuit as a test result.

15. The method of claim 14, wherein said transferring the command trigger signal comprises concurrently transferring the command trigger signal to the first and second memory channels, when the BIST circuit transfers the command set including respective test patterns to the first and second memory channels; and wherein the respective test patterns associated with the first and second memory channels are different test patterns.

16. The method of claim 14, wherein said transferring the command trigger signal comprises sequentially transferring the command trigger signal to the first and second memory channels when the BIST circuit transfers the command set including the respective test pattern to each of the first and second memory channels and the respective test patterns associated with the first and second memory channels are equivalent.

17. The method of claim 14, further comprising performing a repair operation on the defective address using the BIST circuit and redundancy cells of the memory cell array.

\* \* \* \* \*